US012500599B2

(12) United States Patent
Clara et al.

(10) Patent No.: US 12,500,599 B2
(45) Date of Patent: Dec. 16, 2025

(54) DEVICE AND METHOD FOR RECONFIGURABLE COMMON-MODE FEEDBACK CONTROL IN A RECEIVER FRONT END

(71) Applicant: Intel Corporation, Santa Clara, CA (US)

(72) Inventors: Martin Clara, Santa Clara, CA (US); Giacomo Cascio, Villach (AT); Erfan Ghaderi, Hillsboro, OR (US); Marc Jan Georges Tiebout, Finkenstein (AT)

(73) Assignee: Intel Corporation, Santa Clara, CA (US)

( * ) Notice: Subject to any disclaimer, the term of this patent is extended or adjusted under 35 U.S.C. 154(b) by 659 days.

(21) Appl. No.: 17/809,575

(22) Filed: Jun. 29, 2022

(65) Prior Publication Data

US 2024/0007121 A1    Jan. 4, 2024

(51) Int. Cl.
| H03M 1/18 | (2006.01) |
| H03F 3/45 | (2006.01) |
| H03F 3/68 | (2006.01) |
| H03M 1/12 | (2006.01) |

(52) U.S. Cl.
CPC ........ *H03M 1/183* (2013.01); *H03F 3/45475* (2013.01); *H03F 3/45937* (2013.01); *H03F 3/68* (2013.01); *H03M 1/1215* (2013.01); H03F 2200/294 (2013.01); H03F 2200/411 (2013.01); H03F 2200/451 (2013.01); H03F 2203/45418 (2013.01); H03F 2203/45424 (2013.01)

(58) Field of Classification Search
CPC ............... H03M 1/183; H03M 1/1215; H03F 2200/411; H03F 3/45937; H03F 3/68; H03F 2200/294; H03F 2200/451; H03F 2203/45418; H03F 2203/45424; H03F 3/45475
USPC ......................................... 341/141, 149, 155
See application file for complete search history.

(56) References Cited

U.S. PATENT DOCUMENTS 8,031,000 B2 * 10/2011 Ishii ..................... H03F 3/45941
330/258
11,990,879 B2 * 5/2024 Halbert ............... H03F 3/45475

* cited by examiner

*Primary Examiner* — Khai M Nguyen
(74) *Attorney, Agent, or Firm* — 2SPL Patent Attorneys PartG mbB; Yong Beom Hwang (57) ABSTRACT

A radio frequency front-end (RF-FE) device with a reconfigurable common-mode feedback control. The device includes a plurality of RF-FE channels and a reconfiguration switch. An RF-FE channel includes a common-mode feedback loop. The common-mode feedback loop is configured to detect a common-mode signal in differential signals in the RF-FE channel and generate a feedback signal to set the common-mode signal. The reconfiguration switch is configured to couple common-mode feedback loops of two or more RF-FE channels based on an operation mode. The reconfiguration switch may be controlled to couple common-mode feedback loops of two or more RF-FE channels if the two or more RF-FE channels receive a same input signal and decouple common-mode feedback loops of two or more RF-FE channels if the two or more RF-FE channels receive different input signals.

20 Claims, 10 Drawing Sheets

DEVICE AND METHOD FOR RECONFIGURABLE COMMON-MODE FEEDBACK CONTROL IN A RECEIVER FRONT END

BACKGROUND

A conventional technique for high-speed analog-to-digital converters (ADCs) is to parallelize multiple sub-ADCs to achieve a higher conversion rate. This technique is called time-interleaving (TI). Time interleaving may be used in radio frequency (RF) sampling ADCs, where the conversion rate can exceed 10 GS/s.

Figure 1:
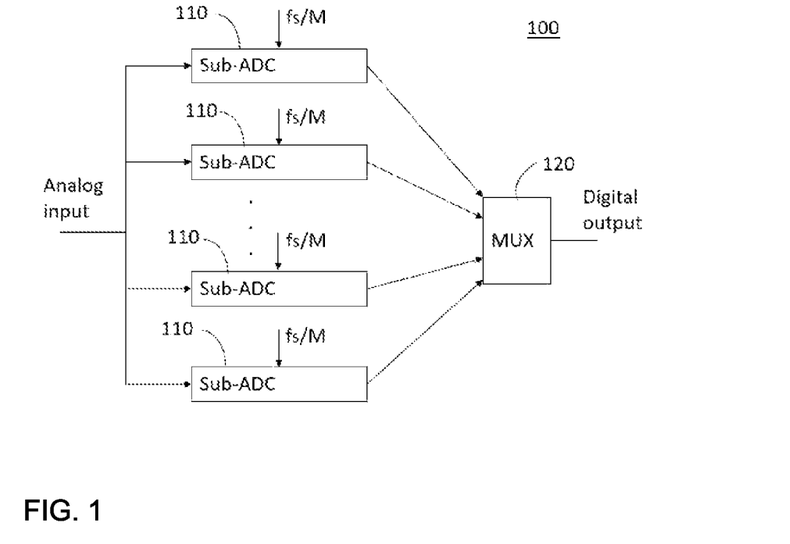
FIG. 1 shows an example TI-ADC.

Time-interleaving of ADCs is a way to increase the overall system sampling rate by using several ADCs (sub-ADCs) in parallel. FIG. 1 shows an example time-interleaving ADC (TI-ADC) 100. The TI-ADC 100 includes a plurality of sub-ADCs 110 (M sub-ADCs) coupled in parallel. Each sub-ADC 110 operates at sampling frequency $f_s/M$ and the overall sampling frequency of the TI-ADC 100 is $f_s$. Each sub-ADC 110 samples the analog input signal at different time instances and the outputs of the sub-ADCs 110 are multiplexed by a multiplexer 120.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 2:
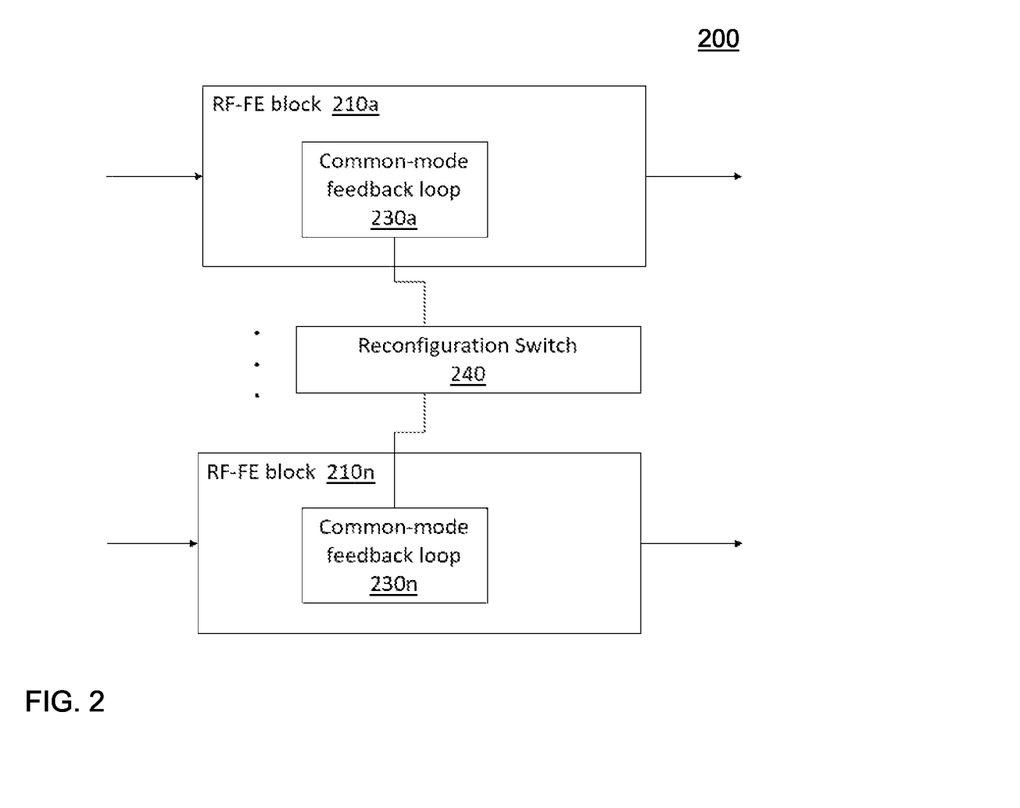
FIG. 2 is a schematic block diagram of an example device with a reconfigurable common-mode feedback control.

Examples are disclosed for a device with a reconfigurable common-mode feedback control in a receiver frontend. FIG. 2 is a schematic block diagram of an example device 200 with a reconfigurable common-mode feedback control. The device 200 may include a plurality of RF-FE channels 210a-210n and a reconfiguration switch 240. An RF-FE channel 210a-210n may include a dedicated common-mode feedback loop 230a-230n. A common-mode feedback loop 230a-230n is configured to detect a common-mode signal in differential signals in each RF-FE channel 210a-210n and generate a feedback signal (negative feedback) to set the common-mode signal (voltage) in each RF-FE channel 210a-210n to a proper/desired value. The reconfiguration switch 240 is configured to selectively couple common-mode feedback loops of two or more RF-FE channels of the plurality of RF-FE channels 210a-210n based on an operation mode. For example, the reconfiguration switch 240 may be controlled to couple common-mode feedback loops of two or more RF-FE channels of the plurality of RF-FE channels 210a-210n if the two or more RF-FE channels receive a same input signal and decouple common-mode feedback loops of two or more RF-FE channels of the plurality of RF-FE channels 210a-210n if the two or more RF-FE channels receive different input signals.

The device 200 may be coupled to multiple sub-ADC banks (not shown). Each RF-FE channel 210a-210n may be coupled to a different sub-ADC bank. Each RF-FE channel 210a-210n may receive an RF input signal from an antenna or a calibration signal. Each RF-FE channel 210a-210n may include a low-noise amplifier (LNA) and a buffer to provide an amplified input signal to the corresponding sub-ADC bank. Each sub-ADC bank may be configured to operate as a time-interleaved ADC. The device 200 may be included in a base station (e.g., a radio base station receiver as defined by the Third Generation Partnership Project (3GPP) or any other wireless communication protocol), or the like.

In one example, an RF input signal (e.g., an RF signal from an antenna) may be coupled to a first RF-FE channel and a calibration signal may be coupled to a second, different, RF-FE channel, and the reconfiguration switch 240 may be configured to de-couple common-mode feedback loops of the first RF-FE channel and the second RF-FE channel. In another example, an RF input signal (e.g., an RF signal from an antenna) may be coupled to a first RF-FE channel and a different RF input signal (e.g., a different RF signal from another antenna or a different RF input signal from another signal source (e.g., a reference signal to perform internal calibration operations)) may be coupled to a second, different, RF-FE channel, and the reconfiguration switch may be configured to de-couple common-mode feedback loops of the first RF-FE channel and the second RF-FE channel.

In some examples, the common-mode feedback loop 230a-230n may include a circuitry configured to measure the common-mode signal from the differential signals in an RF-FE channel, an operational amplifier, and a control transistor. The common-mode signal is coupled to one (e.g., negative) input terminal of the operational amplifier and a common-mode reference value is coupled to the other (e.g., positive) input terminal of the operational amplifier. The "positive" and "negative" terminals of the operational amplifier are interchangeable designators that may be chosen according to the need to guarantee proper functionality of the overall feedback loop. A gate of the control transistor may be driven by an output of the operational amplifier, and an output of the control transistor may be sent as the feedback signal to set the common-mode signal at the sensing point equal to the common-mode reference voltage that appears at the input terminal of the operational amplifier.

The reconfiguration switch 240 may be controlled to couple common-mode feedback loops of two or more RF-FE channels of the plurality of RF-FE channels 210a-210n such that the coupled common-mode feedback loops may form a single common-mode feedback loop. For examples, the common-mode feedback loops of the two or more RF-FE channels may be coupled by coupling negative input terminals of operational amplifiers of the common-mode feedback loops of the two or more RF-FE channels. Alternatively, or additionally, the common-mode feedback loops of the two or more RF-FE channels may be coupled by coupling output nodes of operational amplifiers of the common-mode feedback loops of the two or more RF-FE channels. Alternatively, or additionally, the common-mode feedback loops of the two or more RF-FE channels may be coupled by coupling output nodes of control transistors of the common-mode feedback loops of the two or more RF-FE channels. Alternatively, or additionally, the common-mode feedback loops of the two or more RF-FE channels may be coupled by coupling high impedance nodes of the common-mode feedback loops of the two or more RF-FE channels.

In order to drive the sub-ADCs of a TI-ADC, a low noise amplifier (LNA) and a buffer may be needed in the RF-FE to receive, amplify, and deliver an input signal to the sub-ADCs. Very high-speed ADCs require high levels of time-interleaving (i.e., parallelizing a large number of sub-ADCs) and hence a very powerful RF-FE stage. For ease of implementation, the RF-FE may be divided into multiple channels, where each RF-FE channel drives separate sub-ADCs (a separate sub-ADC bank). This implementation offers the possibility of employing a fraction of sub-ADCs by enabling one or some RF-FE channels and the corresponding sub-ADC bank(s). This may be beneficial when a portion of sub-ADCs is taken offline for calibration purposes. Alternatively, a subset of the sub-ADCs may be used at a reduced sampling rate for a lower-speed lower-power operation potentially in parallel, processing different input signals at a lower sampling rate each.

Figure 3:
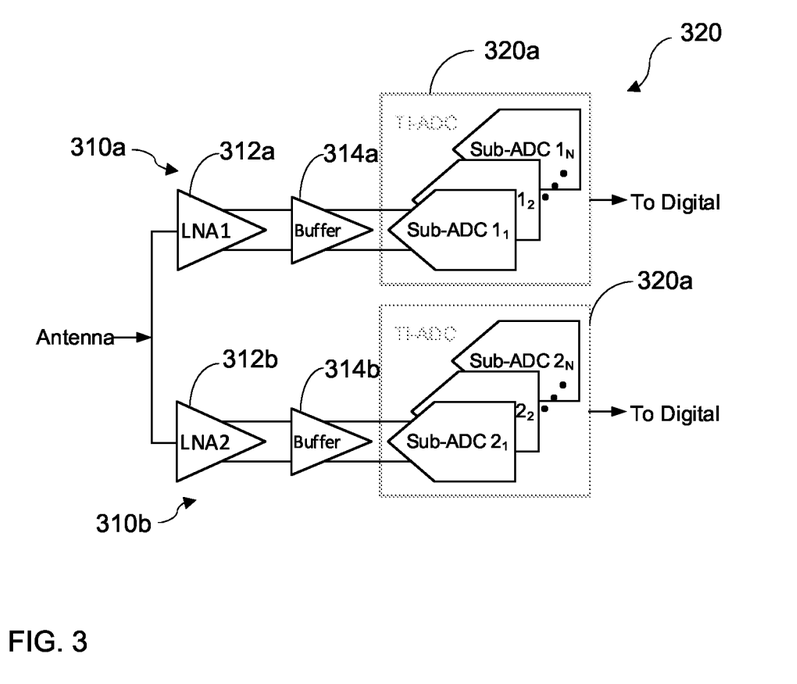
FIG. 3 shows an example RF-sampling ADC with two RF front-end (RF-FE) channels.

FIG. 3 shows an example RF-sampling ADC with two RF-FE channels. The RF-sampling ADC is a TI-ADC 320 including a plurality of sub-ADCs. In this example, the plurality of sub-ADCs are divided into two sub-ADC banks 320a, 320b. Each sub-ADC bank 320a, 320b includes a plurality of sub-ADCs. The RF-FE is divided into two RF-FE channels (circuitries) 310a, 310b. Each sub-ADC bank 320a, 320b is driven by a separate RF-FE channel 310a, 310b. The sub-ADC bank 320a is driven by an RF-FE channel 310a and the sub-ADC bank 320b is driven by an RF-FE channel 310b. Each RF-FE channel 310a, 310b includes an LNA 312a, 312b and a buffer 314a, 314b, respectively. An input signal (e.g., a signal from an antenna) is amplified by the LNA 312a, 312b and then sent to the sub-ADC banks 320a, 320b via the buffers 314a, 314b, respectively for analog-to-digital conversion.

It should be noted that FIG. 3 illustrates two sub-ADC banks 322a, 322b and two RF front-end channels 312a, 312b as an example. Hereafter, the examples will be explained with reference to the case that the sub-ADCs are divided into two sets/banks and two RF front-end channels are provided to drive the two banks of sub-ADCs. However, the sub-ADCs of the TI-ADC may be split into any number of groups (i.e., two or more sub-ADC banks) and the RF-FE circuitry may be divided into any number of RF-FE channels (i.e., two or more RF-FE channels) to drive the multiple sub-ADC banks. The ADC 320 may be any types of ADC, e.g., a pipelined ADC, flash ADCs, or the like.

The LNAs 312a, 312b are differential amplifiers having differential inputs and differential outputs. A differential amplifier needs common-mode feedback (CMFB) circuit to properly set the amplifier's operating point. A CMFB circuit senses the common mode voltage at a chosen point in the differential signal path (e.g., at the LNA output or the buffer output) and compares it with a reference and sends feedback (negative feedback) to cancel the unwanted output common mode and fix the DC outputs to the desired level.

The common-mode voltage of the RF front-end poses a unique challenge in the implementation of the RF-FE shown in FIG. 3. When the system (e.g., a TI-ADC) is operating in a normal mode where the same input signal (e.g., a signal from an antenna) is connected to both RF-FE channels 312a, 312b, a single CMFB loop can regulate the entire RF-FE common mode voltages. However, if not all RF-FE channels are receiving the same input signal, the single-loop CMFB results in common-mode cross-talk between the RF-FE channels and hence degrades the performance and accuracy.

Figure 4A:
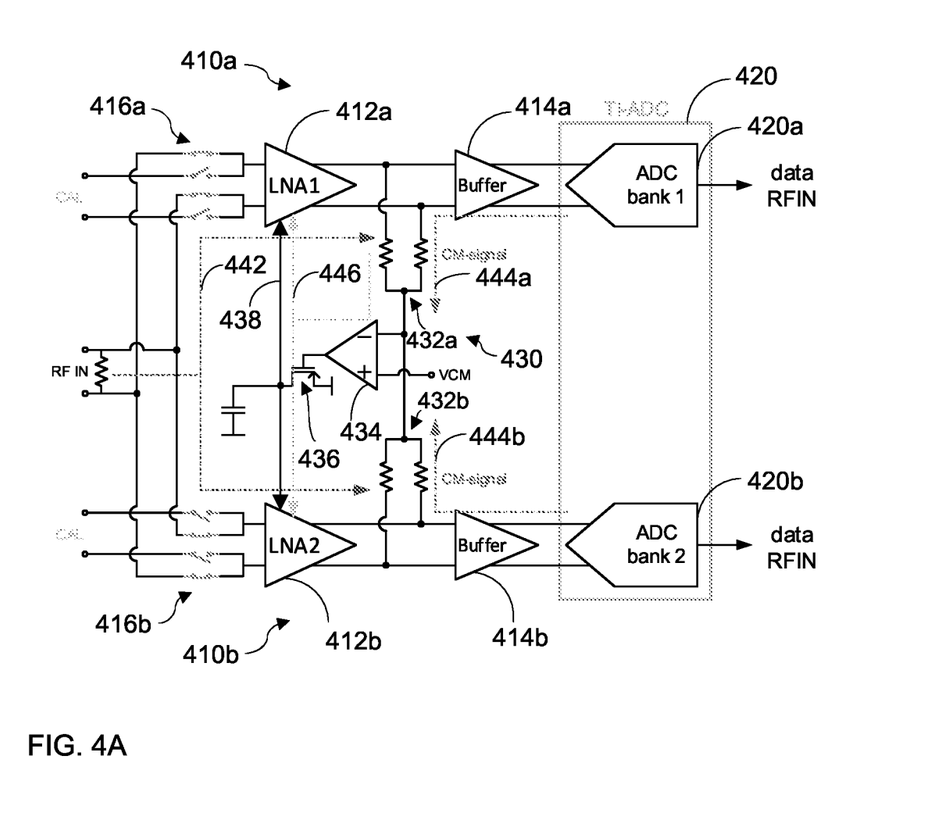
FIG. 4A shows an example implementation of common-mode feedback for the two RF-FE channels where a same input signal is provided to the two RF-FE channels.

FIG. 4A shows an example implementation of common-mode feedback for the two RF-FE channels where a same input signal is provided to the two RF-FE channels. In this example, the sub-ADCs of a TI-ADC 420 are divided into two sub-ADC banks 420a, 420b, and the RF-FE is divided to two RF-FE channels 410a, 410b to drive the two sub-ADC banks 420a, 420b, respectively, and a single common-mode feedback loop/circuitry 430 is provided for setting a common-mode signal in both RF-FE channels 410a, 410b to a desired value/level. Either an RF input signal (RF IN) or a calibration signal (CAL) may be coupled to the RF-FE channels 410a, 410b via switches 416a, 416b. In FIG. 4A, a same signal is provided to the two RF-FE channels 410a, 410b, e.g., the RF input signal (RF IN) is connected to the both RF-FE channels 410a, 410b via switches 416a, 416b, while the calibration signal is disconnected. Each RF-FE channel 410a, 410b includes an LNA 412a, 412b and a buffer 414a, 414b, respectively. The RF input signal (e.g., a signal from an antenna) is amplified by the LNA 412a, 412b and then sent to the sub-ADC banks 420a, 420b via the buffers 414a, 414b, respectively.

The CMFB loop 430 is configured to detect, and set, a common mode voltage in the RF-FE channels 410a, 410b. The internal common-mode voltages in the RF-FE channels 410a, 410b are detected and regulated through the single CMFB loop 430 by sensing the average of the individual RF-FE common-mode voltages and forcing the average to the VCM value (the common mode reference value) by sending feedback (negative feedback) to the LNAs 412a, 412b. For example, the differential outputs of each LNA 412a, 412b (or differential outputs of each buffer 414a, 414b or any points of the differential signals in each RF-FE channel 410a, 410b) are sensed and averaged by the circuitry 432a, 432b to measure the common-mode voltage of each RF-FE channel 410a, 410b, respectively. The common-mode voltages of the two RF-FE channels 410a and 410b are then combined (i.e., averaged) by joining the lines, and fed to one (e.g., negative) input terminal of the amplifier 434 (operational amplifier). The common mode reference value (VCM) is coupled to the other (e.g., positive) input terminal of the amplifier 434. The "positive" and "negative" terminals of the amplifier 434 are interchangeable depending on the functionality of the overall feedback loop. The output of the amplifier 434 drives a gate of the control transistor 436 to generate a feedback signal 438 to the LNAs 412a, 412b to set the common-mode voltage of the LNAs 412a, 412b, directly or indirectly. This structure can be extended to a greater number (N>2) of RF-FE channels.

The arrow 442 indicates the RF input signal flow, the arrows 444a and 444b indicate the common-mode signal flow of the RF-FE channels 410a, 410b, respectively, and the arrow 446 indicates the feedback signal flow to the LNAs 412a, 412b. In the example shown in FIG. 4A, since both RF-FE channels 410a, 410b are driving the same signal (e.g., the RF input signal), no RF-FE cross-talk problem is observed. However, in cases where not all RF-FE channels 410a, 410b receive the same input signal, (e.g., in the case N=2, one RF-FE channel is receiving an RF input signal and the other RF-FE channel is receiving a calibration signal or a different RF input signal), the single-loop CMFB results in (common-mode) cross-talk between the RF-FE channels 410a, 410b and hence degrades both the received signal and the calibration performance and accuracy. This scenario is illustrated in FIG. 4B.

Figure 4B:
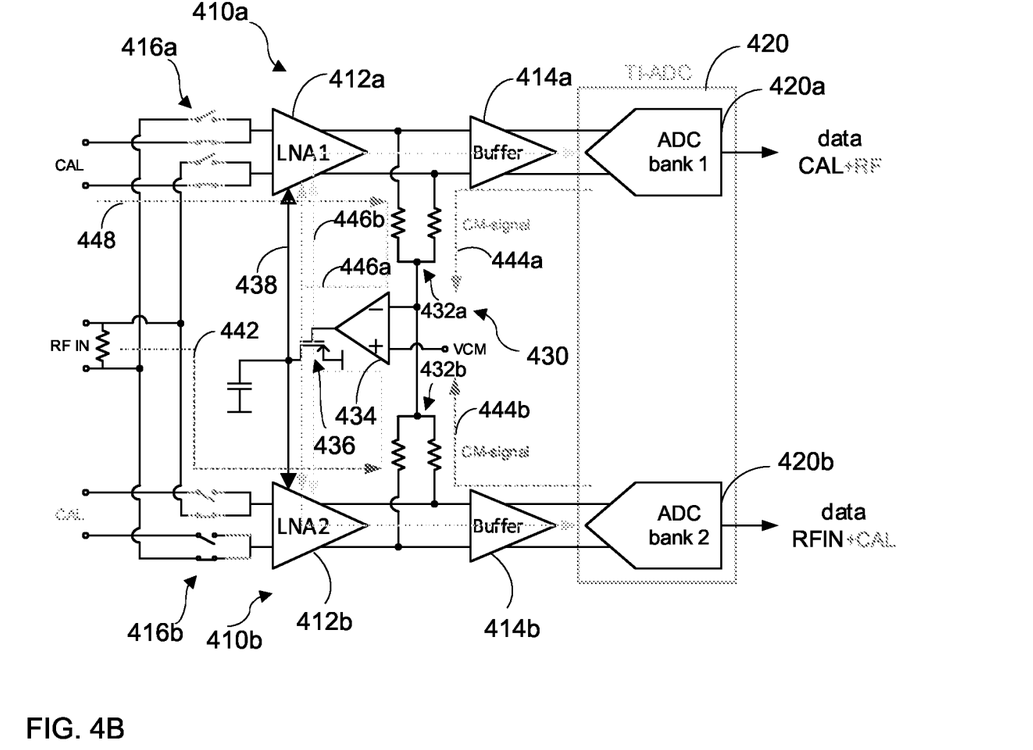
FIG. 4B shows an example implementation of common-mode feedback for the two RF-FE channels where different signals are sent to the two RF-FE channels.

FIG. 4B shows an example implementation of common-mode feedback for the two RF-FE channels where different signals are sent to the two RF-FE channels. The structure of the systems in FIGS. 4A and 4B are the same but in FIG. 4B, the RF-FE channel 410a receives a calibration signal while the RF-FE channel 410b receives an RF input signal. The single CMFB loop 430 coupled to the both RF-FE channels 410a, 410b detects, and sets, a common mode voltage in the RF-FE channels 410a, 410b. As shown in FIG. 4B, the common mode voltages of the two RF-FE channels 410a, 410b are measured and then combined at the negative input of the amplifier 434 and the same feedback signal 438 is sent to both LNAs 412a, 412b.

The arrow 442 indicates the RF input signal flow, the arrow 448 indicates the calibration signal flow, the arrows 444a and 444b indicate the common-mode signal flow of the RF-FE channels 410a, 410b, respectively, the arrow 446a indicates the feedback signal flow to the LNAs 412a, 412b due to the common-mode signal of the RF-FE channel 410a and the arrow 446b indicates the feedback signal flow to the LNAs 412a, 412b due to the common-mode signal of the RF-FE channel 410b. As indicated by the arrows 446a and 446b, a cross-talk between the RF-FE channels 410a, 410b occurs via the single CMFB loop 430 and a fraction of the input RF signal component appears on the output of the sub-ADC bank 420a and a fraction of the calibration signal component also appears on the output of the sub-ADC bank 420b. Due to finite common-mode to differential suppression, a fraction of the common-mode content in one channel will show up as differential signal content in the other channel, which limits the crosstalk isolation in this operating mode. A potentially more serious problem (even with perfect common-mode to differential suppression) is that the common-mode content of one channel will modulate the common-mode control element of the other channel with unrelated signal content, which can lead to cross-modulation of the wanted signal with the unwanted (common-mode) signal of the other channel due to nonlinear effects in inside the RF-FE.

Splitting an ADC (e.g., a TI-ADC) into multiple banks of sub-ADCs (e.g., each sub-ADC bank being time-interleaved to a lower degree) and driving each sub-ADC bank by a dedicated RF-FE channel has some advantages. It allows background calibration of one (or more) sub-ADC bank and the associated RF-FE channel by appropriate injection of a calibration signal, while processing an RF input signal on other sub-ADC bank(s) as shown in FIG. 4B. Another advantage is that the ADC can be split into smaller portions and entirely different input signals may be processed by the multiple banks of sub-ADCs in parallel, at a lower sampling rate. However, in any case, a single CMFB control loop has some problems, if the signals processed in the individual groups of sub-ADCs are not identical.

To improve the performance and quality in the single-loop CMFB control, following solutions may be implemented. To minimize the cross-talk effect when the LNAs are driven by different signals, strong filtering of the common-mode signals may be implemented. In this technique, a very low-frequency filter (e.g., an R-C filter) may be used at the common node (e.g., at the negative input of the operational amplifier 434) to minimize the AC signals and hence only DC common-mode signal will be shared between the two LNAs. However, in this common-mode filter solution, low-frequency filtering comes with silicon area cost and slow common-mode response, which can result in long settling times when switching between different operating modes.

Alternatively, the unwanted signal (i.e., the cross-talk effect) in each sub-ADC bank may be detected and removed later through a digital post-processing. However, the post-processing technique requires identification of the unwanted crosstalk transfer functions between each RF-FE channel and sub-ADC bank. This adds considerable complexity to the overall system and may require periodic measurement of the crosstalk transfer functions in case of (slow) parameter drift. The digital post-processing is even more difficult in terms of processing and identification complexity in case of any nonlinear interaction between the two channels.

Alternatively, to completely remove the problems in the single-loop CMFB implementation, a fully isolated dual-loop CMFB in case of two LNAs (in general, N CMFB control loops in case of N LNAs, N being a positive integer) may be employed.

Figure 5:
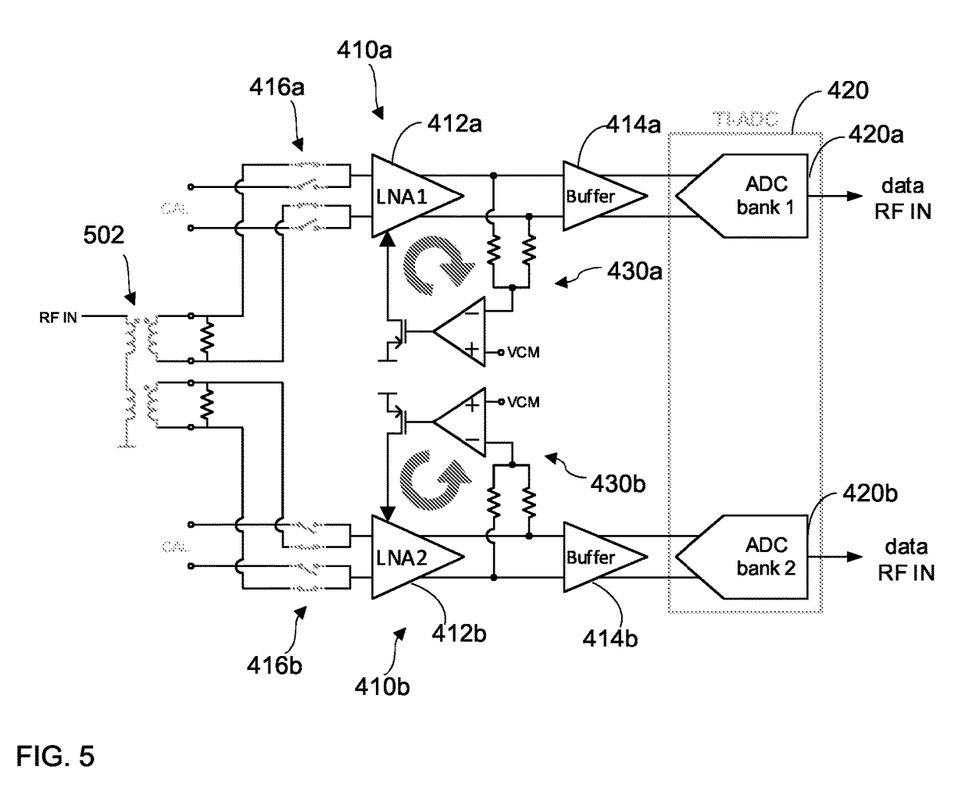
FIG. 5 shows a fully independent common-mode feedback (CMFB) implementation for full isolation between the RF-FE channels.

FIG. 5 shows a fully independent CMFB implementation for full isolation between the RF-FE channels. As shown in FIG. 5, two separate CMFB loops 430a and 430b are provided and each LNA 412a, 412b may regulate its common-mode voltage independently using a dedicated CMFB loop 430a, 430b, respectively. Therefore, in this case, there will not be any cross-talks between the RF-FE channels 410a and 410b.

In the dual-loop implementation of FIG. 5, since the common-mode voltages are fully isolated, the inputs of the LNAs 412a, 412b cannot be connected directly. If the inputs are connected, the two loops 430a, 430b try to regulate the same node, and this easily makes both loops 430a, 430b unstable. To remove the possibility of common-mode instability, in this case the RF inputs should be AC-coupled 502 as shown in FIG. 5, so they can carry the same AC signal, but the common-mode DC voltages are still regulated independently. However, this causes the receiver to not convert low-frequency inputs, thus it limits the applicability of the design. For applications that require low input signal frequency, AC-coupling generally becomes costly, since either big on-chip capacitors (silicon area) or external elements (capacitors or transformers) are needed.

In examples, a reconfigurable CMFB control structure is used. By implementing a reconfigurable CMFB structure, the disadvantages of the single-loop and dual-loop implementations (described above) can be avoided, while the advantages of both structures are preserved. Compared to the single-loop CMFB, the reconfigurable CMFB is always stable, and no high-cost additional components are needed when operating in a different mode. Also, compared to the dual-loop implementation, the reconfigurable CMFB control solution offers DC-coupling and hence broader applicability.

Figure 6:
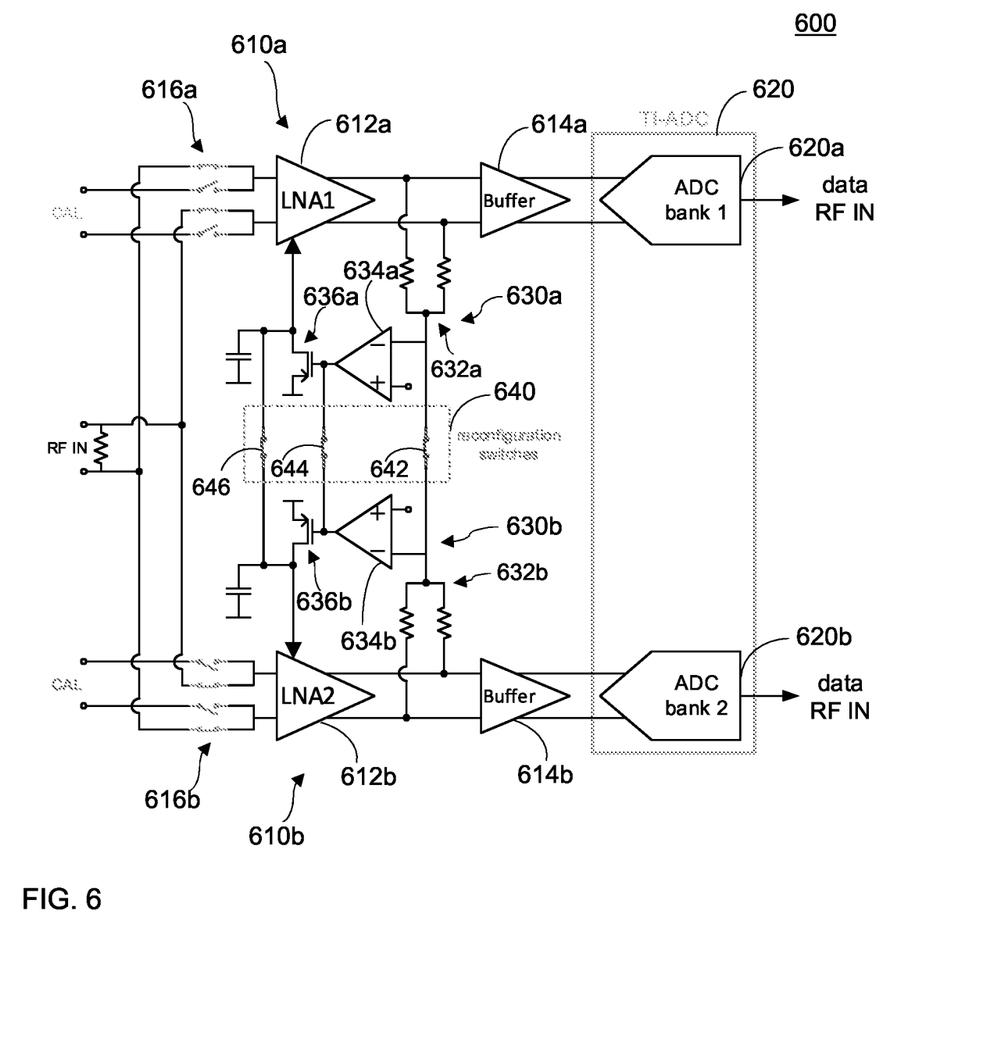
FIG. 6 shows an example implementation of reconfigurable CMFB control for the RF-FE channels.

FIG. 6 shows an example implementation of reconfigurable CMFB control for the RF-FE channels. The example system 600 includes two RF-FE channels 610a, 610b and a TI-ADC 620. The sub-ADCs of the TI-ADC 620 are divided into two sub-ADC banks 620a, 620b. As stated above, the system 600 may include more than two RF-FE channels and the TI-ADC may be divided into more than two sub-ADC banks, and the RF-FE channels 610a, 610b may be used to drive different types of ADCs (e.g., a pipelined ADC, flash ADCs, etc.) or different systems. Each sub-ADC bank 620a, 620b is driven by a dedicated RF-FE channel 610a, 610b. Each RF-FE channel 610a, 610b includes an LNA 612a, 612b and a buffer 614a, 614b, respectively. The system 600 includes a plurality of CMFB loops 630a, 630b (two CMFB loops 630a, 630b in this example). Each CMFB loop 630a, 630b is coupled to one RF-FE channel 610a, 610b and detects and sets a common mode on the coupled RF-FE channel 610a, 610b. In the example shown in FIG. 6, a CMFB loop 630a is coupled to a RF-FE channel 610a and detects and sets a common mode on the RF-FE channel 610a, and a CMFB loop 630b is coupled to a RF-FE channel 610b and detects and sets a common mode on the RF-FE channel 610b.

The system 600 further includes a reconfiguration switch 640. The reconfiguration switch 640 changes the CMFB loop implementation, depending on the operation mode. The reconfiguration switch 640 is configured to selectively couple the CMFB loops 630a, 630b depending on the operation mode such that the coupled CMFB loops 630a, 630b form a single CMFB loop. When both RF-FE channels 610a, 610b are receiving the same signal (e.g., either a receiver main signal (RF input signal) or a calibration signal (CAL)), the reconfiguration switch 740 is turned on to couple the CMFB loops 630a and 630b to form a single CMFB loop. This results in a stable single-loop CMFB that provides the same common-mode voltages to the both RF-FE channels 610a and 610b, which is favorable because of the same input signals that they carry. FIG. 6 shows the case that the RF input signal is coupled to both RF-FE channels 610a and 610b and the reconfiguration switch couples the CMFB blocks 630a and 630b. This configuration is applied when the RF-FE channels 610a and 610b both receive a calibration signal. The CMFB loops 630a and 630b are coupled to form a single CMFB loop when both RF-FE channels 610a and 610b are in the calibration mode and receiving the same signal (i.e., the calibration signal). Guaranteeing the single-loop structure is a necessity for a stable CMFB, when the RF-FE inputs are directly connected. As mentioned earlier, implementing two CMFB loops with a shared node results in instability caused by two feedback loops fighting against each other.

In the mode where one RF-FE channel is in a receive mode (i.e., receiving an RF input signal) and the other RF-FE channel is in a calibration mode (i.e., receiving a calibration signal) or in a receive mode but receiving a different input signal (e.g., the two RF-FE channels 610a, 610b are receiving different input signals), the reconfiguration switch 640 may be turned off so that the CMFB loops 630a and 630b are disconnected and the CMFB loops 630a and 630b operate as two fully independent loops. The physical isolation achieved by turning off the reconfiguration switch 640 causes the minimal cross-talks between the RF-FE channels 610a, 610b (as opposed to the single-loop CMFB implementation) without any heavy filtering or digital post-processing.

The example structure shown in FIG. 6 can be extended to the case where the RF-FE is split into more than two RF-FE channels to drive more than two sub-ADC banks. For example, a TI-ADC including N individual sub-ADC banks each of which is driven by a dedicated RF-FE channel may be used as a single ADC where all RF-FE channels receive the same input signal. This results in the highest sampling rate. In this mode, all CMFB loop circuits are connected to form a single CMFB loop that senses the average of all output (or intermediate node) common-mode voltages from all RF-FE channels and forces this average to the internal reference voltage (provided at the +input of the servo amplifiers 632a, 632b in FIG. 6). If one (or some) the RF-FE channel(s) is connected to a different input signal, either for calibration or for processing a different input signal, its CMFB loop of the concerned RF-FE channel(s) is disconnected from the common-mode control of other RF-FE channel(s) and independently controls the common-mode voltage of the concerned RF-FE channel(s). This process can be applied to all RF-FE channels that receive a different input signal. For example, if all N RF-FE channels receive different input signal (e.g., all N sub-ADC banks receive different input signals), all N CMFB loops may be isolated from one another and operate independently.

The individual CMFB circuits may be connected (for the same signal processing of the respective RF-FE channels that the CMFB circuits control) by joining so-called "voltage" nodes or high-impedance nodes. A high impedance node/voltage node is a node that does not have any low impedance paths to any other nodes in the frequency range being considered. A high-impedance node (or "voltage" node) in a circuit has no (or only a very small, negligible amount, e.g., leakage) current flowing along the interconnect forming the node, typically the gate node of an FET-transistor or a capacitor connection. Topological identical circuits operated under the same (or very similar) electrical conditions, like the two individual common-mode feedback loops in this example, can be connected at their high-impedance nodes (at least one, the "merging quality" becoming better, if connected at more than one, best when connecting all such nodes) without changing the overall basic functionality of the circuit aside from the fact that, in this case, two or more feedback loops become nominally a single feedback loop, but still behaving like the original (individual) feedback loop(s), with a correspondingly reduced number of input/output nodes (same differential input signal nominally the same common-mode feedback action). In this case, the reconfiguration switch 640 does not carry any current and can be optimized for isolation in the off-state. For example, if implemented with CMOS-technology, field effect transistor (FET) switches may be used and the FET switches may be either single polarity or complementary, depending on the voltage level the internal nodes to be joined are operated.

For example, the internal nodes used for coupling the individual CMFB loops 630*a*, 630*b* may be the input node of the servo amplifier 634*a*, 634*b* (e.g., the negative (−) input of the servo amplifier 634*a*, 634*b*), the output node of the servo amplifier 634*a*, 634*b* driving the gate of a control transistor 636*a*, 636*b* that directly or indirectly sets the common-mode voltage of the RF-FE channels, or the output node of the control transistor 636*a*, 636*b* that sets the common-mode voltage of the RF-FE channel by setting its voltage supply (the leftmost reconfiguration switch in FIG. 6). The switch 642 couples the input nodes of the servo amplifiers 634*a*, 634*b*, the switch 644 couples the output nodes of the servo amplifiers 634*a*, 634*b*, and the switch 646 couples the output nodes of the control transistors 636*a*, 636*b*. One or more or all switches 642, 644, 646 may be switched on to couple the CMFB loops 630*a* and 630*b* to form a single CMFB loop.

Additional nodes (voltage/high impedance nodes) in the RF-FE CMFB circuit may be coupled to form a single CMFB loop. For example, there may be appropriate voltage/high impedance nodes inside the servo amplifier 632*a*, 632*b* that can additionally be joined via an FET switch(es) (a single switch or a transmission gate) for common RF-signal operation. Alternatively, a common-mode actuator in the RF-FE controlled by a DC-current may be used. For example, a common-mode control via DC-current comprises injecting a DC-current into the tail node of a differential pair (i.e., changing the tail current) or injecting a (pair of) DC-currents into the output nodes of a differential amplifier (i.e., changing the load current). In both cases the actuator is a transistor (or two) acting as a current source, controlled by the common-mode feedback signal. In these cases, the high-impedance node that can be used for reconfiguration is the input (gate) node of these current source transistors. In this case, the actual control nodes may not be joined (the reconfiguration switch 646).

Figure 7:
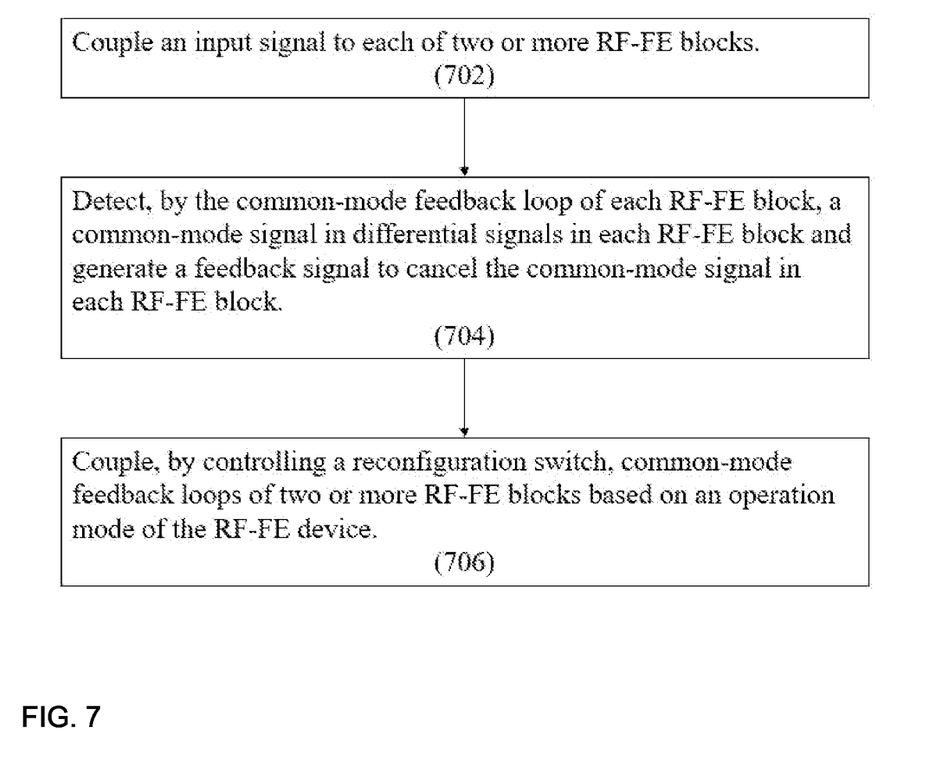
FIG. 7 is an example flow diagram of a method for reconfiguring common-mode feedback control in an RF-FE device.

FIG. 7 is an example flow diagram of a method for reconfiguring common-mode feedback control in an RF-FE device. The RF-FE device includes a plurality of RF-FE channels, and an RF-FE channel includes a common-mode feedback loop. The method includes coupling an input signal to each of two or more RF-FE channels (702). The method includes detecting, by the common-mode feedback loop of each RF-FE channel, a common-mode signal in differential signals in each RF-FE channel and generating a feedback signal to set the common-mode signal in each RF-FE channel (704). The method includes coupling, by controlling a reconfiguration switch, common-mode feedback loops of two or more RF-FE channels based on an operation mode of the RF-FE device (706).

For example, if an RF input signal is coupled to a first RF-FE channel and a calibration signal is coupled to a second, different, RF-FE channel, common-mode feedback loops of the first RF-FE channel and the second RF-FE channel may be de-coupled. In another example, if an RF input signal is coupled to a first RF-FE channel and a different RF input signal is coupled to a second, different, RF-FE channel, common-mode feedback loops of the first RF-FE channel and the second RF-FE channel may be de-coupled.

The common-mode feedback loop may include a circuitry configured to measure the common-mode signal from the differential signals in each RF-FE channel, an operational amplifier, and a control transistor. The common-mode signal may be coupled to one input terminal of the operational amplifier and a common-mode reference value is coupled to the other input terminal of the operational amplifier and a gate of the control transistor may be driven by an output of the operational amplifier, and an output of the control transistor may be sent as the feedback signal to set the common-mode signal. The common-mode feedback loops of the two or more RF-FE channels may be coupled by coupling negative input terminals of operational amplifiers of the common-mode feedback loops of the two or more RF-FE channels. Alternatively, or additionally, the common-mode feedback loops of the two or more RF-FE channels may be coupled by coupling output nodes of operational amplifiers of the common-mode feedback loops of the two or more RF-FE channels. Alternatively, or additionally, the common-mode feedback loops of the two or more RF-FE channels may be coupled by coupling output nodes of control transistors of the common-mode feedback loops of the two or more RF-FE channels. Alternatively, or additionally, the common-mode feedback loops of the two or more RF-FE channels are coupled by coupling high impedance nodes of the common-mode feedback loops of the two or more RF-FE channels.

Figure 8:
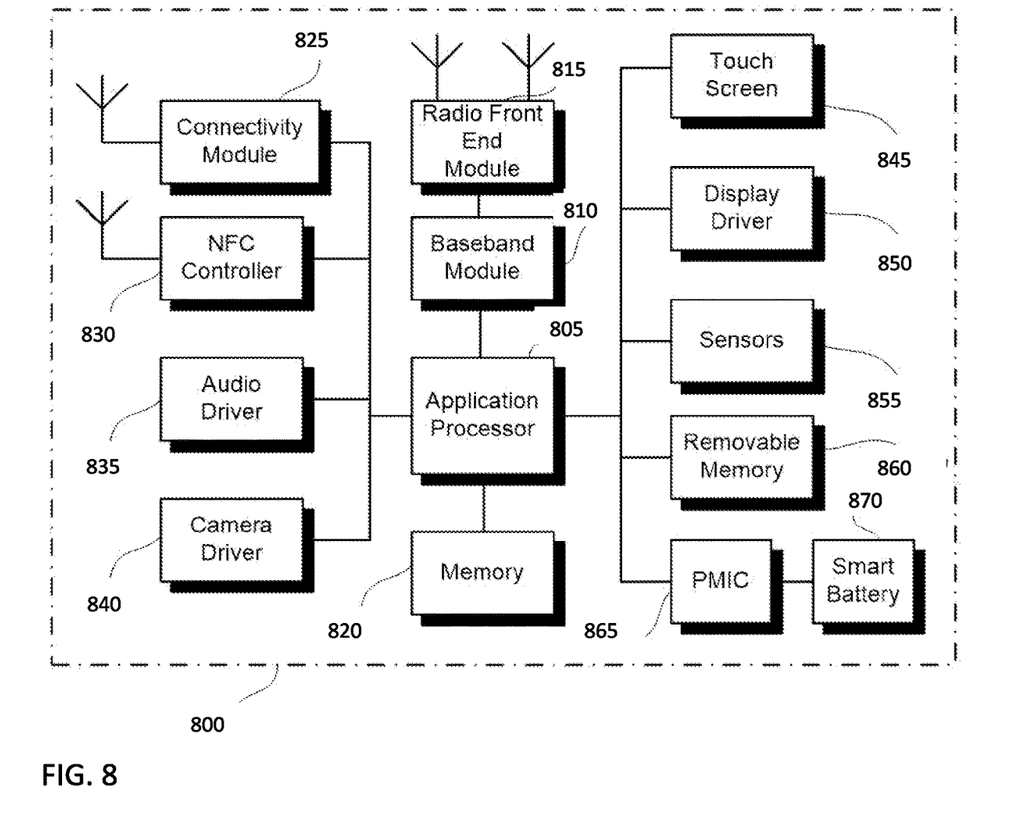
FIG. 8 illustrates a user device in which the examples disclosed herein may be implemented.

FIG. 8 illustrates a user device 800 in which the examples disclosed herein may be implemented. For example, the examples disclosed herein may be implemented in the radio front-end module 815, in the baseband module 810, etc. The user device 800 may be a mobile device in some aspects and includes an application processor 805, baseband processor 810 (also referred to as a baseband module), radio front end module (RFEM) 815, memory 820, connectivity module 825, near field communication (NFC) controller 830, audio driver 835, camera driver 840, touch screen 845, display driver 850, sensors 855, removable memory 860, power management integrated circuit (PMIC) 865 and smart battery 870.

In some aspects, application processor 805 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 810 may be implemented, for example, as a solder-down substrate including one or more integrated circuits, a single packaged integrated circuit soldered to a main circuit board, and/or a multi-chip module containing two or more integrated circuits.

Figure 9:
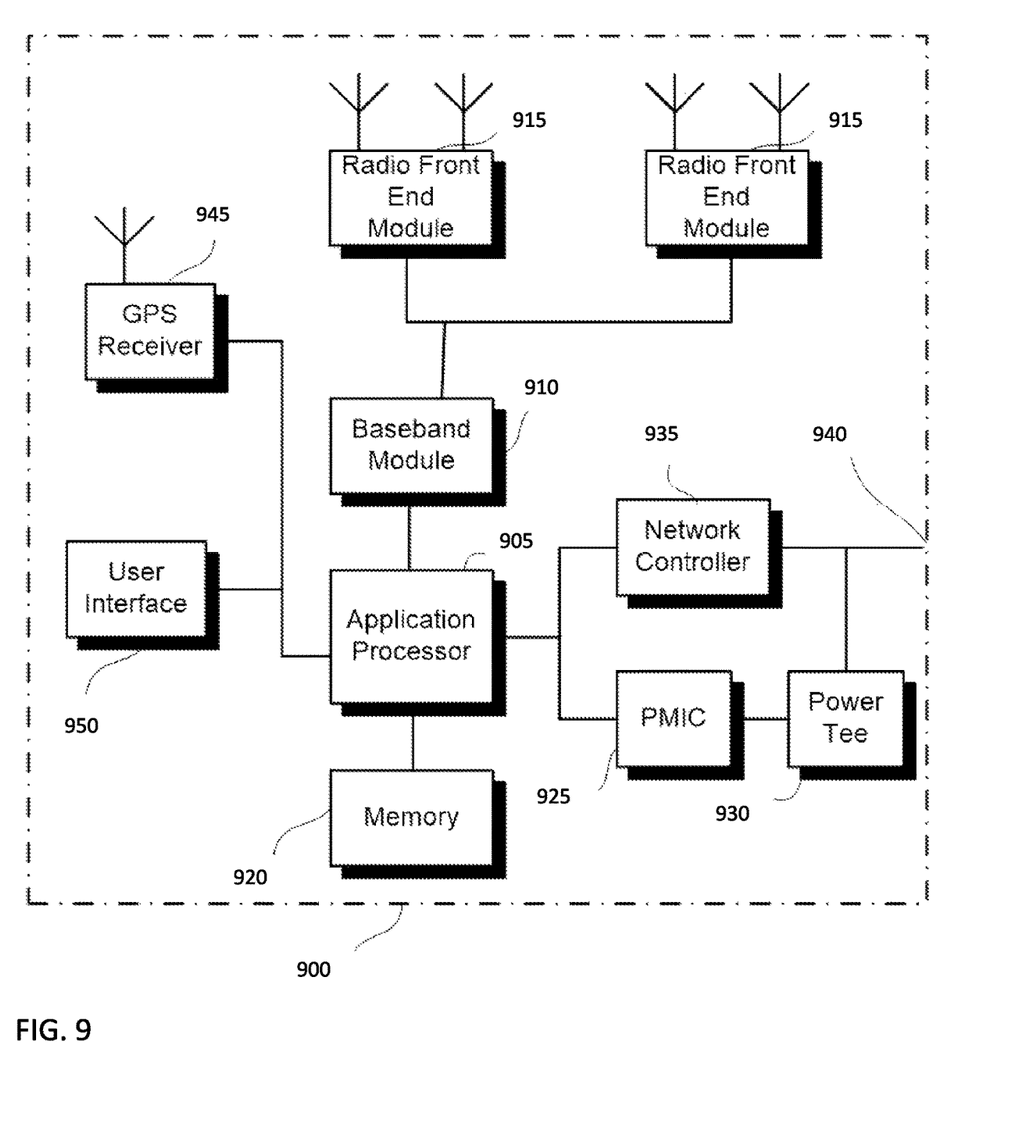
FIG. 9 illustrates a base station or infrastructure equipment radio head in which the examples disclosed herein may be implemented.

FIG. 9 illustrates a base station or infrastructure equipment radio head 900 in which the examples disclosed herein may be implemented. For example, the examples disclosed herein may be implemented in the radio front-end module 915, in the baseband module 910, etc. The base station radio head 900 may include one or more of application processor 905, baseband modules 910, one or more radio front end modules 915, memory 920, power management circuitry 925, power tee circuitry 930, network controller 935, network interface connector 940, satellite navigation receiver module 945, and user interface 950.

In some aspects, application processor 905 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 910 may be implemented, for example, as a solder-down substrate including one or more integrated circuits, a single packaged integrated circuit soldered to a main circuit board or a multi-chip module containing two or more integrated circuits.

In some aspects, memory 920 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 920 may be implemented as one or more of solder down packaged integrated circuits, socketed memory modules and plug-in memory cards.

In some aspects, power management integrated circuitry 925 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 930 may provide for electrical power drawn from a network cable to provide both power supply and data connectivity to the base station radio head 900 using a single cable.

In some aspects, network controller 935 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 945 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 945 may provide data to application processor 905 which may include one or more of position data or time data. Application processor 905 may use time data to synchronize operations with other radio base stations.

In some aspects, user interface 950 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to an RF-FE device with a reconfigurable common-mode feedback control. The RF-FE device include a plurality of RF-FE channels and a reconfiguration switch. An RF-FE channel includes a common-mode feedback loop. The common-mode feedback loop is configured to detect a common-mode signal in differential signals in the RF-FE channel and generate a feedback signal to set the common-mode signal to a desired value. The reconfiguration switch is configured to couple common-mode feedback loops of two or more RF-FE channels based on an operation mode of the RF-FE device.

Another example (e.g., example 2) relates to a previously described example (e.g., example 1), wherein if an RF input signal is coupled to a first RF-FE channel and a calibration signal is coupled to a second, different, RF-FE channel, the reconfiguration switch is configured to de-couple common-mode feedback loops of the first RF-FE channel and the second RF-FE channel.

Another example (e.g., example 3) relates to a previously described example (e.g., as in any one of examples 1-2), wherein if an RF input signal is coupled to a first RF-FE channel and a different RF input signal is coupled to a second, different, RF-FE channel, the reconfiguration switch is configured to de-couple common-mode feedback loops of the first RF-FE channel and the second RF-FE channel.

Another example (e.g., example 4) relates to a previously described example (e.g., as in any one of examples 1-3), wherein the common-mode feedback loop comprises a circuitry configured to measure the common-mode signal from the differential signals in the RF-FE channel, an operational amplifier, and a control transistor. The common-mode signal is coupled to one input terminal of the operational amplifier and a common-mode reference value is coupled to the other input terminal of the operational amplifier. A gate of the control transistor is driven by an output of the operational amplifier, and an output of the control transistor is sent as the feedback signal to set the common-mode signal.

Another example (e.g., example 5) relates to a previously described example (e.g., example 4), wherein the common-mode feedback loops of the two or more RF-FE channels are coupled by coupling negative input terminals of operational amplifiers of the common-mode feedback loops of the two or more RF-FE channels.

Another example (e.g., example 6) relates to a previously described example (e.g., example 4), wherein the common-mode feedback loops of the two or more RF-FE channels are coupled by coupling output nodes of operational amplifiers of the common-mode feedback loops of the two or more RF-FE channels.

Another example (e.g., example 7) relates to a previously described example (e.g., example 4), wherein the common-mode feedback loops of the two or more RF-FE channels are coupled by coupling output nodes of control transistors of the common-mode feedback loops of the two or more RF-FE channels.

Another example (e.g., example 8) relates to a previously described example (e.g., example 4), wherein the common-mode feedback loops of the two or more RF-FE channels are coupled by coupling high impedance nodes of the common-mode feedback loops of the two or more RF-FE channels.

Another example (e.g., example 9) relates to a previously described example (e.g., as in any one of examples 1-8), wherein each RF-FE channel is coupled to a different bank of sub-ADCs.

Another example (e.g., example 10) relates to a previously described example (e.g., example 9), wherein each bank of sub-ADCs is configured to operate as a time-interleaved ADC.

Another example (e.g., example 11) relates to a base station comprising the RF-FE device as in any one of examples 1-10.

Another example (e.g., example 12) relates to a method for reconfiguring common-mode feedback control in an RF-FE device. The RF-FE device includes a plurality of RF-FE channels, and an RF-FE channel includes a common-mode feedback loop. The method includes coupling an input signal to each of two or more RF-FE channels, detecting, by the common-mode feedback loop of each RF-FE channel, a common-mode signal in differential signals in each RF-FE channel and generating a feedback signal to set the common-mode signal in each RF-FE channel to a desired value, and coupling, by controlling a reconfiguration switch, common-mode feedback loops of two or more RF-FE channels based on an operation mode of the RF-FE device.

Another example (e.g., example 13) relates to a previously described example (e.g., example 12), wherein if an RF input signal is coupled to a first RF-FE channel and a calibration signal is coupled to a second, different, RF-FE channel, common-mode feedback loops of the first RF-FE channel and the second RF-FE channel are de-coupled.

Another example (e.g., example 14) relates to a previously described example (e.g., as in any one of examples 12-13), wherein if an RF input signal is coupled to a first RF-FE channel and a different RF input signal is coupled to a second, different, RF-FE channel, common-mode feedback loops of the first RF-FE channel and the second RF-FE channel are de-coupled.

Another example (e.g., example 15) relates to a previously described example (e.g., as in any one of examples 12-14), wherein the common-mode feedback loop comprises a circuitry configured to measure the common-mode signal from the differential signals in each RF-FE channel, an operational amplifier, and a control transistor. The common-mode signal is coupled to one input terminal of the operational amplifier and a common-mode reference value is coupled to the other input terminal of the operational amplifier. A gate of the control transistor is driven by an output of the operational amplifier, wherein an output of the control transistor is sent as the feedback signal to set the common-mode signal.

Another example (e.g., example 16) relates to a previously described example (e.g., example 15), wherein the common-mode feedback loops of the two or more RF-FE channels are coupled by coupling negative input terminals of operational amplifiers of the common-mode feedback loops of the two or more RF-FE channels.

Another example (e.g., example 17) relates to a previously described example (e.g., example 15), wherein the common-mode feedback loops of the two or more RF-FE channels are coupled by coupling output nodes of operational amplifiers of the common-mode feedback loops of the two or more RF-FE channels.

Another example (e.g., example 18) relates to a previously described example (e.g., example 15), wherein the common-mode feedback loops of the two or more RF-FE channels are coupled by coupling output nodes of control transistors of the common-mode feedback loops of the two or more RF-FE channels.

Another example (e.g., example 19) relates to a previously described example (e.g., example 15), wherein the common-mode feedback loops of the two or more RF-FE channels are coupled by coupling high impedance nodes of the common-mode feedback loops of the two or more RF-FE channels.

Another example (e.g., example 20) relates to a non-transitory machine-readable storage including machine readable instructions, when executed, to implement a method as in any one of examples 12-19.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A radio frequency front-end (RF-FE) device with a reconfigurable common-mode feedback control, comprising:
    a plurality of RF-FE channels, an RF-FE channel including a common-mode feedback loop, the common-mode feedback loop being configured to detect a common-mode signal in differential signals in the RF-FE channel and generate a feedback signal to set the common-mode signal to a desired value; and
    a reconfiguration switch configured to couple common-mode feedback loops of two or more RF-FE channels based on an operation mode of the RF-FE device.

2. The RF-FE device of claim 1, wherein if an RF input signal is coupled to a first RF-FE channel and a calibration signal is coupled to a second, different, RF-FE channel, the reconfiguration switch is configured to de-couple common-mode feedback loops of the first RF-FE channel and the second RF-FE channel.

3. The RF-FE device of claim 1, wherein if an RF input signal is coupled to a first RF-FE channel and a different RF input signal is coupled to a second, different, RF-FE channel, the reconfiguration switch is configured to de-couple common-mode feedback loops of the first RF-FE channel and the second RF-FE channel.

4. The RF-FE device of claim 1, wherein the common-mode feedback loop comprises:
    a circuitry configured to measure the common-mode signal from the differential signals in the RF-FE channel;
    an operational amplifier, wherein the common-mode signal is coupled to one input terminal of the operational amplifier and a common-mode reference value is coupled to the other input terminal of the operational amplifier; and
    a control transistor, wherein a gate of the control transistor is driven by an output of the operational amplifier, and an output of the control transistor is sent as the feedback signal to set the common-mode signal.

5. The RF-FE device of claim 4, wherein the common-mode feedback loops of the two or more RF-FE channels are coupled by coupling negative input terminals of operational amplifiers of the common-mode feedback loops of the two or more RF-FE channels.

6. The RF-FE device of claim 4, wherein the common-mode feedback loops of the two or more RF-FE channels are coupled by coupling output nodes of operational amplifiers of the common-mode feedback loops of the two or more RF-FE channels.

7. The RF-FE device of claim 4, wherein the common-mode feedback loops of the two or more RF-FE channels are coupled by coupling output nodes of control transistors of the common-mode feedback loops of the two or more RF-FE channels.

8. The RF-FE device of claim 4, wherein the common-mode feedback loops of the two or more RF-FE channels are coupled by coupling high impedance nodes of the common-mode feedback loops of the two or more RF-FE channels.

9. The RF-FE device of claim 1, wherein each RF-FE channel is coupled to a different bank of sub-ADCs.

10. The RF-FE device of claim 9, wherein each bank of sub-ADCs is configured to operate as a time-interleaved ADC.

11. A base station comprising the RF-FE device of claim 1.

12. A method for reconfiguring common-mode feedback control in a radio frequency front-end (RF-FE) device, wherein the RF-FE device includes a plurality of RF-FE channels, and an RF-FE channel includes a common-mode feedback loop, the method comprising:
    coupling an input signal to each of two or more RF-FE channels;
    detecting, by the common-mode feedback loop of each RF-FE channel, a common-mode signal in differential signals in each RF-FE channel and generating a feedback signal to set the common-mode signal in each RF-FE channel to a desired value; and
    coupling, by controlling a reconfiguration switch, common-mode feedback loops of two or more RF-FE channels based on an operation mode of the RF-FE device.

13. The method of claim 12, wherein if an RF input signal is coupled to a first RF-FE channel and a calibration signal is coupled to a second, different, RF-FE channel, common-mode feedback loops of the first RF-FE channel and the second RF-FE channel are de-coupled.

14. The method of claim 12, wherein if an RF input signal is coupled to a first RF-FE channel and a different RF input signal is coupled to a second, different, RF-FE channel, common-mode feedback loops of the first RF-FE channel and the second RF-FE channel are de-coupled.

15. The method of claim 12, wherein the common-mode feedback loop comprises:
- a circuitry configured to measure the common-mode signal from the differential signals in the RF-FE channel;
- an operational amplifier, wherein the common-mode signal is coupled to one input terminal of the operational amplifier and a common-mode reference value is coupled to the other input terminal of the operational amplifier; and
- a control transistor, wherein a gate of the control transistor is driven by an output of the operational amplifier, wherein an output of the control transistor is sent as the feedback signal to set the common-mode signal.

16. The method of claim 15, wherein the common-mode feedback loops of the two or more RF-FE channels are coupled by coupling negative input terminals of operational amplifiers of the common-mode feedback loops of the two or more RF-FE channels.

17. The method of claim 15, wherein the common-mode feedback loops of the two or more RF-FE channels are coupled by coupling output nodes of operational amplifiers of the common-mode feedback loops of the two or more RF-FE channels.

18. The method of claim 15, wherein the common-mode feedback loops of the two or more RF-FE channels are coupled by coupling output nodes of control transistors of the common-mode feedback loops of the two or more RF-FE channels.

19. The method of claim 15, wherein the common-mode feedback loops of the two or more RF-FE channels are coupled by coupling high impedance nodes of the common-mode feedback loops of the two or more RF-FE channels.

20. A non-transitory machine-readable storage including machine readable instructions, when executed, to implement a method of claim 12.

* * * * *